(12) United States Patent
Winkler et al.

(10) Patent No.: US 6,963,202 B2
(45) Date of Patent: Nov. 8, 2005

(54) TESTING INTERFACE FOR RAILROAD SIGNAL RELAYS

(75) Inventors: Joseph C. Winkler, Punta Gorda, FL (US); Paul J. Galburt, Punta Gorda, FL (US); Allan G. Swahn, North Fort Myers, FL (US)

(73) Assignee: Ultra-Tech Enterprises, Inc., Punta Gorda, FL (US)

( * ) Notice: Subject to any disclaimer, the term of this patent is extended or adjusted under 35 U.S.C. 154(b) by 430 days.

(21) Appl. No.: 10/209,008

(22) Filed: Jul. 31, 2002

(65) Prior Publication Data

US 2004/0024555 A1 Feb. 5, 2004

(51) Int. Cl.[7] .............................................. G01R 31/327
(52) U.S. Cl. ...................................... 324/418; 324/415
(58) Field of Search .................... 324/415, 418–424, 324/724, 72.5, 754–758

(56) References Cited

U.S. PATENT DOCUMENTS

| | | | | |
|---|---|---|---|---|
| 4,092,587 A | * | 5/1978 | Selkow, Jr. ................. | 324/415 |
| 4,311,961 A | * | 1/1982 | Holt et al. ................... | 324/418 |
| 5,256,973 A | * | 10/1993 | Thee et al. .................. | 324/418 |
| 5,453,695 A | * | 9/1995 | Sparling et al. ............. | 324/418 |
| 5,491,419 A | * | 2/1996 | Kerdiya et al. ............. | 324/418 |
| 5,933,019 A | * | 8/1999 | Depue ......................... | 324/761 |

* cited by examiner

Primary Examiner—Anjan Deb
(74) Attorney, Agent, or Firm—Chase Law Firm, L.C.

(57) ABSTRACT

A testing interface provides rapid, temporary connections to individual signal relays used in railroad signal systems when testing is required, and otherwise permits normal operation of railroad signal vital circuits through its connections. A connectivity block provides contacts that are used to isolate the relay from its application circuit and provide connectivity to the relay coils for testing when a connection paddle is inserted into the block. The interface allows fully automated or manual testing of installed relays without requiring removal from the relay rack.

18 Claims, 4 Drawing Sheets

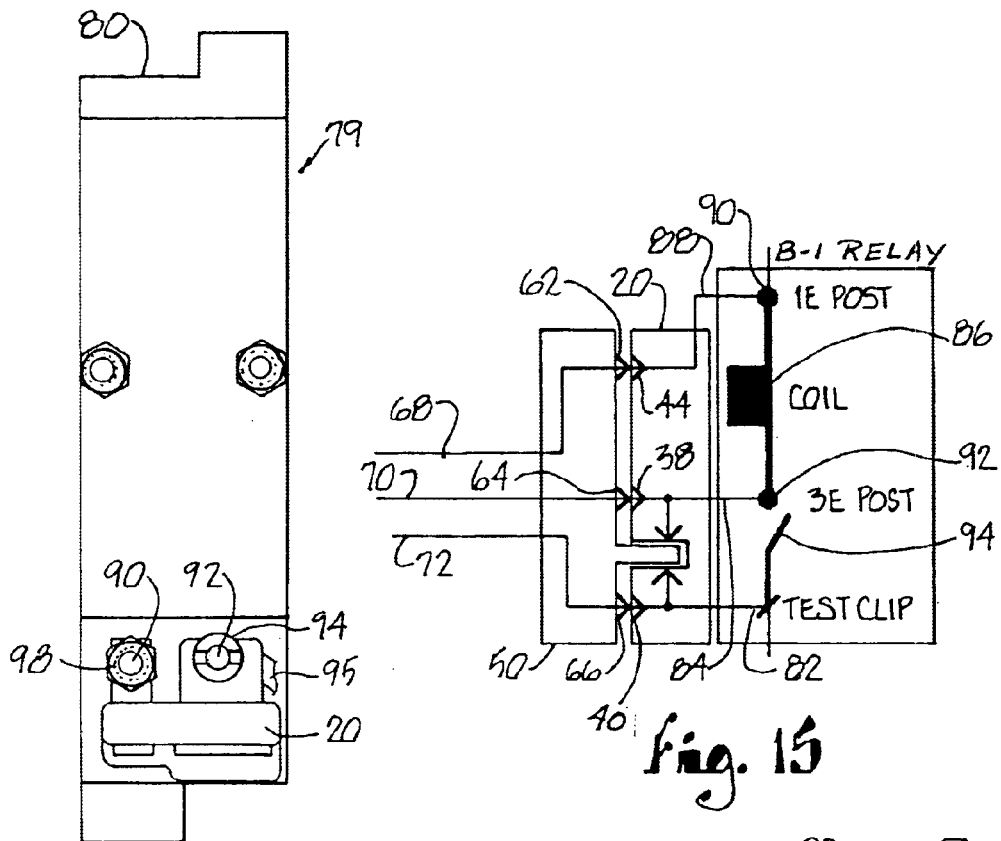
Fig. 14
Fig. 15
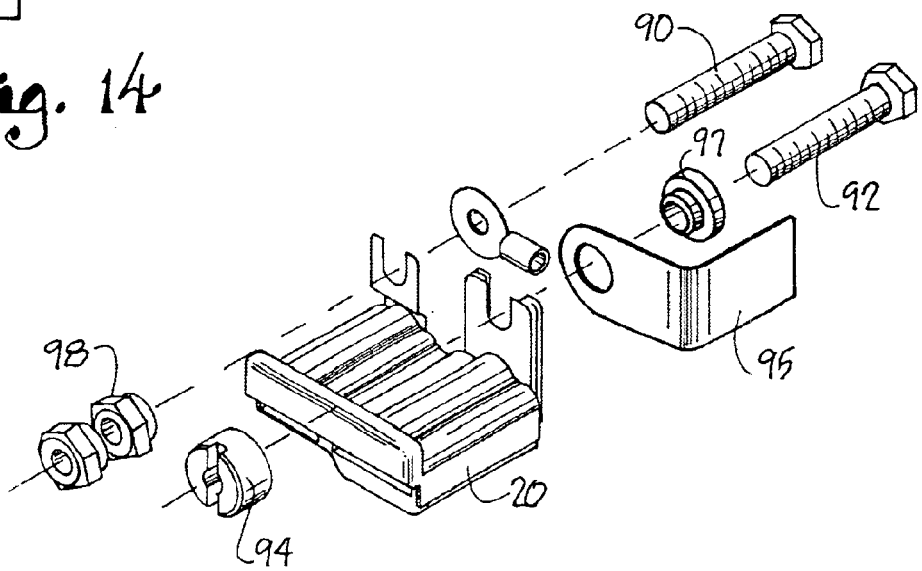
Fig. 16

TESTING INTERFACE FOR RAILROAD SIGNAL RELAYS

This invention relates to an improved method and apparatus for connecting the signal relays used in railroad signal systems to test equipment for periodic testing and, in particular, to a testing interface that permits normal operation of vital circuits through its connections, rapidly temporarily disconnects a relay under test from its application circuit without requiring physical removal of the relay, and during testing both isolates the relay from its application circuit and establishes connections to automatic or manual test equipment.

BACKGROUND OF THE INVENTION

Railroad signal relays have been in use for 100 years or more. Many installations in use today have been in service for over sixty years. Typically, signal relays are installed in bungalows or field cases alongside the tracks. As these enclosures are neither heated nor air-conditioned, the relays are thus exposed to temperature extremes as well as vibration from passing trains. Therefore, rugged design is essential.

Furthermore, safety and fail-safe operation concerns are of prime importance in the design and operation of railroad signaling systems. To meet the fail-safe requirements, most relays are of the gravity type, meaning that the armature falls to a de-energized position under the force of gravity when the coil is not energized. An energized coil overcomes the gravity force and picks up the armature. Both normally open and normally closed contacts are employed. Contacts are relatively massive due to current carrying requirements and exposure to current and voltage surges from lightning strikes and other transients.

As part of the fail-safe design of vital circuits, many relays are normally in the energized, or picked, state. Any interruption of power in the coil circuit, whether due to power supply failure or a signal wire break, causes the relay to open. This results in a more restrictive and safer condition.

Gravity relays are mounted in a particular orientation to work properly, and are typically designed as either shelf-mounted or rack-mounted. Shelf-mounted relays are usually mounted on shock mounts fastened to a shelf within a wayside bungalow. Connection wires with soldered or crimped ring terminals are bolted to studs on top of the relay. Shelf relays are individually installed along many shelves.

Rack mounted relays are designed to interface with standard blocks mounted on a vertical frame in horizontal rows. Blocks come in different sizes depending upon relay type and relay manufacturer. A commonly used block system uses two size blocks. The B-1 block has a width of 2.5 inches while the B-2 block has a width of 5 inches. The mounting design and hardware for these blocks is identical, allowing them to be intermixed in rows according to the design requirements of the signaling system.

Connections from the field wiring are made to the rear of the B-1 or B-2 blocks. Connections are either fastened to studs using ring terminals or inserted into slots using special crimped terminals with retaining clips. These terminals may be removed using a special tool and re-inserted into another connection slot as desired.

A B-1 or B-2 type relay is mounted to the front of the B-1 or B-2 block. The mating surface of the relay has spring contacts that mate with the wiring terminals inserted in the slots from the rear. Two rods are used as guides for the relay during insertion. These rods are threaded on the ends and are further used to firmly retain the relay in place with knurled nuts and lock nuts. Other mounting and retention designs by other manufacturers perform the same functions using slightly different mechanisms.

On the most commonly used relay block system, the coil connections are brought out to the front of the block below the relay. Two stud connections are provided. One connection (called the 1E post) provides the low side or DC return side of the circuit. The other connection (called the 3E post for B-1 relays and the 5E post for B-2 relays) provides the control signal or energizing side of the circuit. This connection is made through a special stud with a nonconductive shoulder that isolates a ring terminal placed around the shouldered stud from the stud itself. A barrel nut is screwed down over the stud to make contact with the ring terminal and thereby connect the control signal to the high side of the coil. The barrel nut may be opened (unscrewed) to disconnect the circuit from the relay for testing purposes without removing any wires, and is frequently used by maintenance personnel to drop a given relay.

Although the barrel nut may be loosened to drop a particular relay, there is no easy way to test an individual relay in a rack. Due to the safety issues involved in railroad signaling, regulatory requirements dictate periodic testing of relays employed in vital signaling circuits. These tests are typically performed on a two-year cycle.

Testing requires that a relay first have its coil saturated. The coil current is then slowly decreased until the relay drops. The current at which the drop occurs is recorded as the drop current. The current is further reduced to zero and then slowly increased until the relay picks up. This current is recorded as the pick current. Close observation of the armature is required to determine the drop and pick points. Careful and slow increase and decrease of the coil current is necessary in order to obtain accurate and repeatable readings of pick-up and drop-away currents.

Prior art as practiced in some Union Switch and Signal relays incorporates a pair of test contacts on the front surface of the installed relay. These contacts are placed in series with the coil circuit and are normally closed to maintain a circuit through the coils. A test probe may be inserted that separates the contacts and opens the coil circuit. At the same time, conductive surfaces on each side of the test probe each make contact with one of the contacts. Two conductive leads from the probe provide the ability to connect test equipment to the circuit or to the coil as required. A separate connection must be made by another means to the low side of the coil (or DC return) to complete a test circuit through the relay coil.

SUMMARY OF THE INVENTION

The testing interface of the present invention includes a connectivity block provided with contact assemblies that provide connections to external test equipment, and quickly and easily installs under the barrel nut on the 3E or 5E post. A connection paddle, having leads extending therefrom to the test equipment, is inserted into one or more contact assemblies in the block associated with a relay under test. The paddle may be instantly withdrawn when the test is complete, and inserted into the block installed on the next relay to be tested. Upon withdrawal of the paddle, the conductivity block reestablishes the circuit to the relay coil.

Each connectivity block may be installed only for the duration of the test and then removed, since the labor time for installation is only a few seconds, typically 5 to 10 seconds. Alternatively, the connectivity blocks may be installed on the relays and then left in place permanently, further shortening test time when the two-year test cycle is repeated.

The testing interface permits a better and more efficient test methodology by facilitating the utilization of a software-controlled system to perform the test measurements. A computer controlled ramp voltage (or current) is generated to drive the relay coil via the connection to the relay through the connection paddle and conductivity block. The voltage is carefully monitored during the ramp. As the armature picks or drops, it interacts magnetically with the coil and causes back electromotive forces (EMFs) that are detectable and measurable by the system. The electronic measurement system can therefore accurately and repeatedly detect the drop-away and pick-up points of the relay without the need to remove the relay from the rack.

BRIEF DESCRIPTION OF THE DRAWINGS

FIG. 14 is a front elevational view of FIG. 13;

FIG. 15 is a circuit diagram of the paddle and connectivity block and an associated relay;

FIG. 16 is an exploded perspective view of connectivity block and relay block posts of FIG. 13.

DETAILED DESCRIPTION

Figure 1:
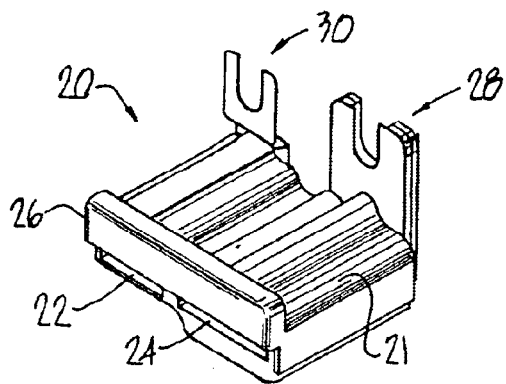
FIG. 1 is a perspective view of the connectivity block of the present invention.

Referring to FIGS. 1 and 3–6, a connectivity block 20 of the present invention includes a body 21 having two side-by-side slots 22 and 24 in the front surface 26 of body 21 that provide connectivity access to respective contact bracket assemblies 28 and 30 within the block 20. The slots 22 and 24 extend in parallel through the body 21 from front to rear as is evident from a comparison of FIGS. 3 and 4. The body 21 is composed of an insulating material such as a durable, extruded plastic.

Figure 5:
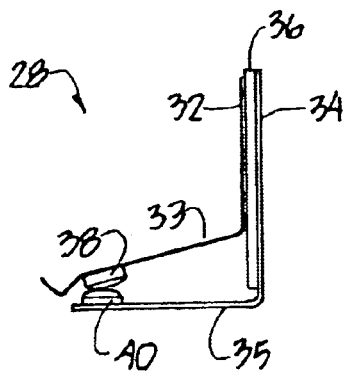
FIG. 5 is a diagrammatic side elevational view of the double contacts of the connectivity block, shown removed from the body of the block and somewhat reduced in scale as compared with FIGS. 3 and 4.
Figure 6:
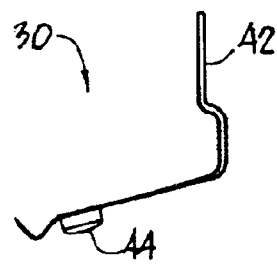
FIG. 6 is a diagrammatic side elevational view of the single contact of the connectivity block, shown removed from the body of the block and on the same scale as FIG. 5.
Figure 7:
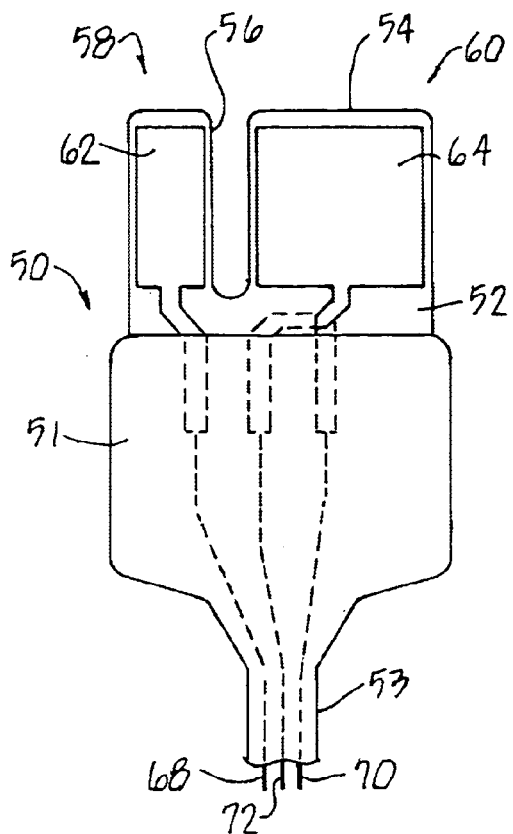
FIG. 7 is a diagrammatic top plan view of the connection paddle.
Figure 8:
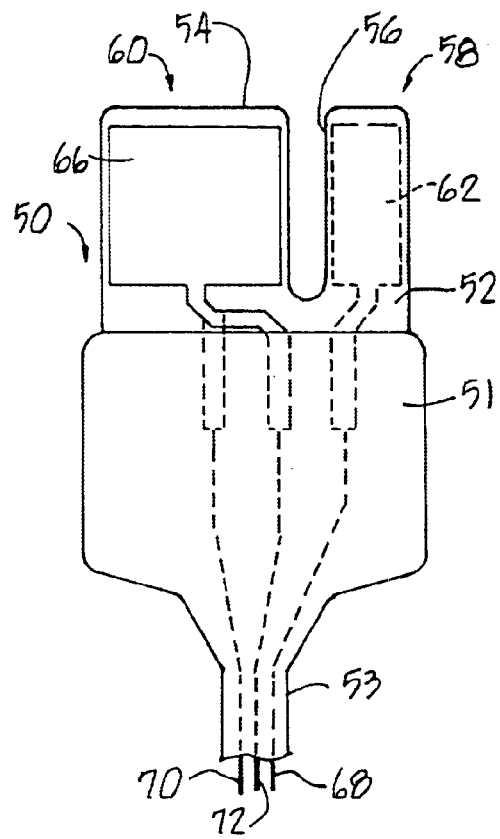
FIG. 8 is a diagrammatic bottom plan view of the connection paddle.
Figure 9:
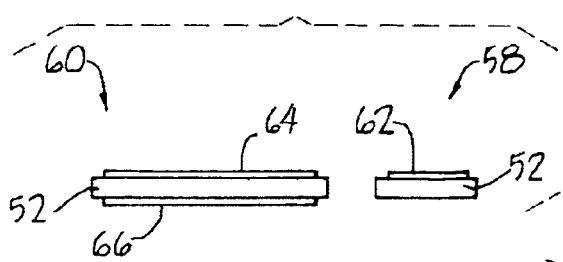
FIG. 9 is a diagrammatic front end view of the paddle prongs, the thickness of the conductive pads being enlarged for clarity.

The contact assembly 28 comprises a pair of generally L-shaped elements as seen in FIG. 5. As viewed, the upstanding portions thereof present a pair of spade lugs 32 and 34 separated by an insulation layer 36. The other legs 33 and 35 extend into slot 24 from the rear (FIG. 4), the assembly 28 being secured to block body 21 by a screw 46 or other fastening means.

Figure 10:
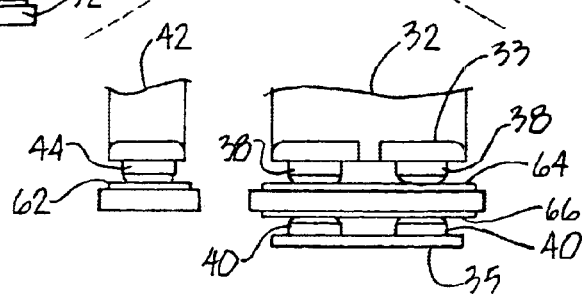
FIG. 10 is a diagrammatic partial front view of the paddle prongs engaged with the connectivity block contacts, parts being broken away and the body of the block removed for clarity.

Legs 33 and 35 are provided with spaced, redundant contacts 38 and 40, respectively (see FIG. 10). Leg 33 is bifurcated to present a pair of resilient arms each carrying an associated contact 38, the purpose of which is described below. The contacts 38 and 40 are low-resistance, high-current contacts that provide a reliable and safe connection for the vital circuit to which lugs 32 and 34 are connected in use.

Connectivity block 20 also has a single spring contact bracket assembly 30 that is positioned within the narrower slot 22. Assembly 30 is also of generally L-shaped configuration and presents a spade lug 42 projecting from the rear end of slot 22, and a low-resistance, high-current contact 44 disposed within slot 22 for access from the front of block 20. A screw 48 or other suitable fastening means secures assembly 30 to body 21.

Referring to FIGS. 7–12, a test paddle or probe 50 is designed to be inserted into the two slots 22 and 24 and make connections to the contacts 38, 40, and 44. The head 51 of the paddle 50 may be fabricated from a nonconductive substrate material 52, such as printed circuit board material for example, and shaped with a beveled leading edge 54 and a longitudinal slot 56 in the paddle 50. The slot 56 in the paddle 50 essentially separates the paddle into two sections or prongs 58 and 60 that simultaneously insert into the two slots 22 and 24 respectively in the connectivity block 20. As the paddle 50 is grasped by its handle 53 and inserted into connectivity block 20, the beveled leading edge 54 separates the two pairs of contacts 38 and 40 of the contact assembly 28 and engages the contact 44 of the spring contact assembly 30.

Conductive surfaces 62, 64 and 66 on the paddle 50 make separate electrical contact with the internal contacts 44, 38 and 40 respectively. The wiping action of the insertion process ensures a good electrical connection between the conductive surfaces and the contacts. Wires 68, 70 and 72 in the paddle 50 extend through the handle 53 and connect to the contact surfaces 62, 64 and 66 respectively, and thus provide electrical connections to the relay (discussed hereinbelow).

Referring to FIGS. 13–16, in use the connectivity block 20 makes three connections through contacts 38, 40 and 44 to a relay 79 mounting block 80, one each to the relay circuit 82, the high side 84 of the relay coil 86, and the low side 88 of the relay coil 86 (DC return or 1E post 90). The connections to the relay circuit 82 and the high side of the relay coil are made at the 3E (or 5E) post 92. The barrel nut 94 on post 92 is first loosened using the standard railroad barrel nut tool. As the barrel nut 94 is loosened, the connection between the relay circuit 82 and the high side 84 of the relay coil 86 is opened (FIG. 15) as the barrel nut 94 is withdrawn from contact with the ring terminal component 95 of the terminal. A slot 96 (see FIGS. 3 and 4) presented by the insulated spade lugs 32, 34 is slightly wider than the diameter of the 3E stud 92, and allows the lugs to slide up onto the 3E stud 92 and under the barrel nut 94. The barrel nut 94 is then tightened to firmly secure the connectivity block 20 in place. This connects the top contacts 38 (as viewed in FIG. 5) to the barrel nut 94, thereby establishing contact with the stud 92 and the high side of the relay coil 84. The bottom contacts 40 are connected to the ring terminal component 95 and the relay circuit 82. The slot 96 in the bottom contact lug 34 is wider than that in the upper contact lug 32 and designed so that it fits over the nonconductive shoulder washer 97 around the stud 92 and is prevented from contacting the 3E stud 92.

The third contact 44 in connectivity block 20 is located in slot 22 separated from the contacts 38 and 40. In the B-1 connectivity block 20 implementation (FIG. 1), spade lug 42 is positioned under the hex nut 98 on the 1E post 90, thereby connecting contact 44 with the low side 88 of the coil 86 and DC return.

The 1E post 90 contact may be a spring terminal fashioned in such a way that the terminal hooks over the end of the 1E post 90. When the barrel nut 94 on the 3E post 92 is tightened, it applies pressure to the entire block resulting in spring tension on the terminal 95 hooked over the 1E post, providing the electrical connection. This method would most likely be used when the connectivity block 20 is installed temporarily for testing, rather than permanently.

Figure 2:
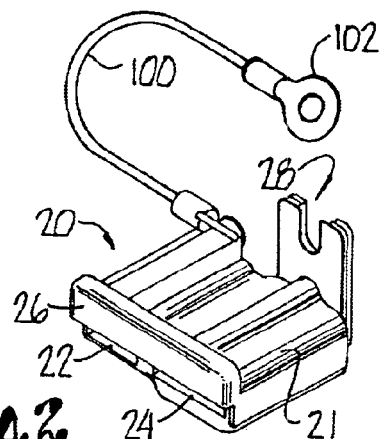
FIG. 2 is a perspective view of another embodiment of the connectivity block of the present invention.
Figure 3:
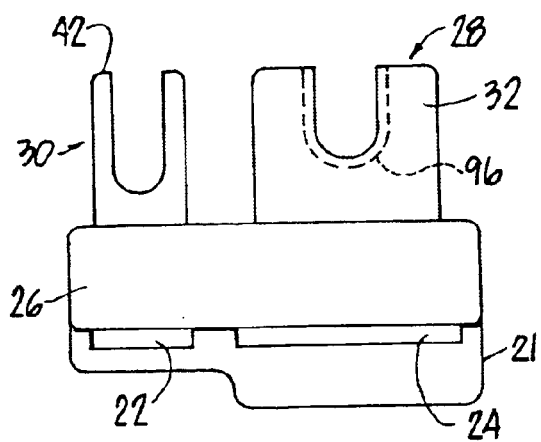
FIG. 3 is a diagrammatic front elevational view of the connectivity block of FIG. 1.
Figure 4:
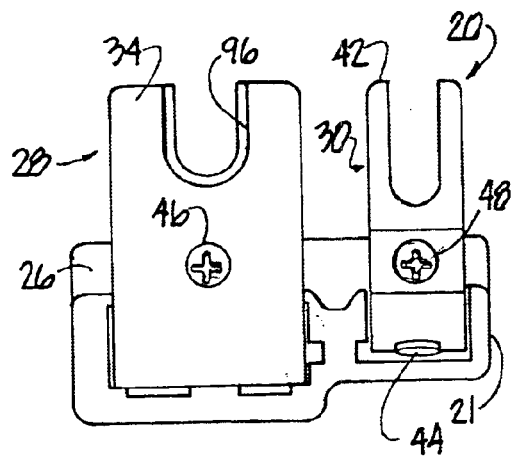
FIG. 4 is a diagrammatic rear elevational view of the connectivity block of FIG. 1.

Referring to FIG. 2, in an alternate implementation, such as for the B-2 relay block (not shown) where the 1E post is not located under the terminal, a short wire 100 connected to the spring contact 44 (FIG. 6) is used to connect to the 1E post. This wire 100 has a ring terminal 102, which is placed under the 1 E post nut and tightened. Alternatively, a clip lead or other temporary connection may be used for those situations where the user does not intend to leave the connectivity block 20 in place.

Alternate configurations for shelf relays utilize the same principles as the B2 relay block application for shelf relays with horizontal posts. For shelf relays with vertical posts, and adapter arm is utilized for the 3E connection to transition the vertical post to a horizontal connection. In all shelf relay applications, wires and ring terminal extend from the 1E terminal of the block to the negative side of the relay coil.

Figure 11:
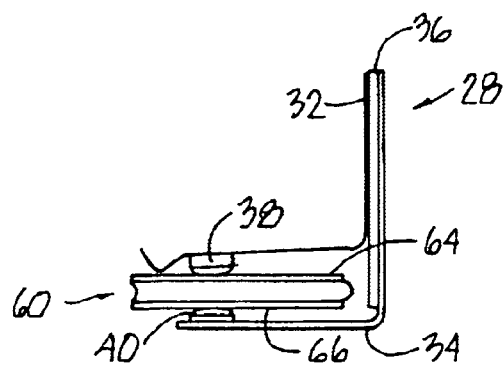
FIG. 11 is a diagrammatic partial side view of a paddle prong engaged with the double contacts of the connectivity block.
Figure 12:
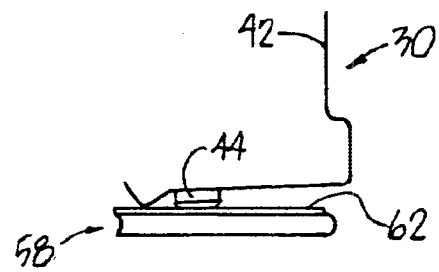
FIG. 12 is a diagrammatic partial side view of a paddle prong engaged with the single contact of the connectivity block.
Figure 13:
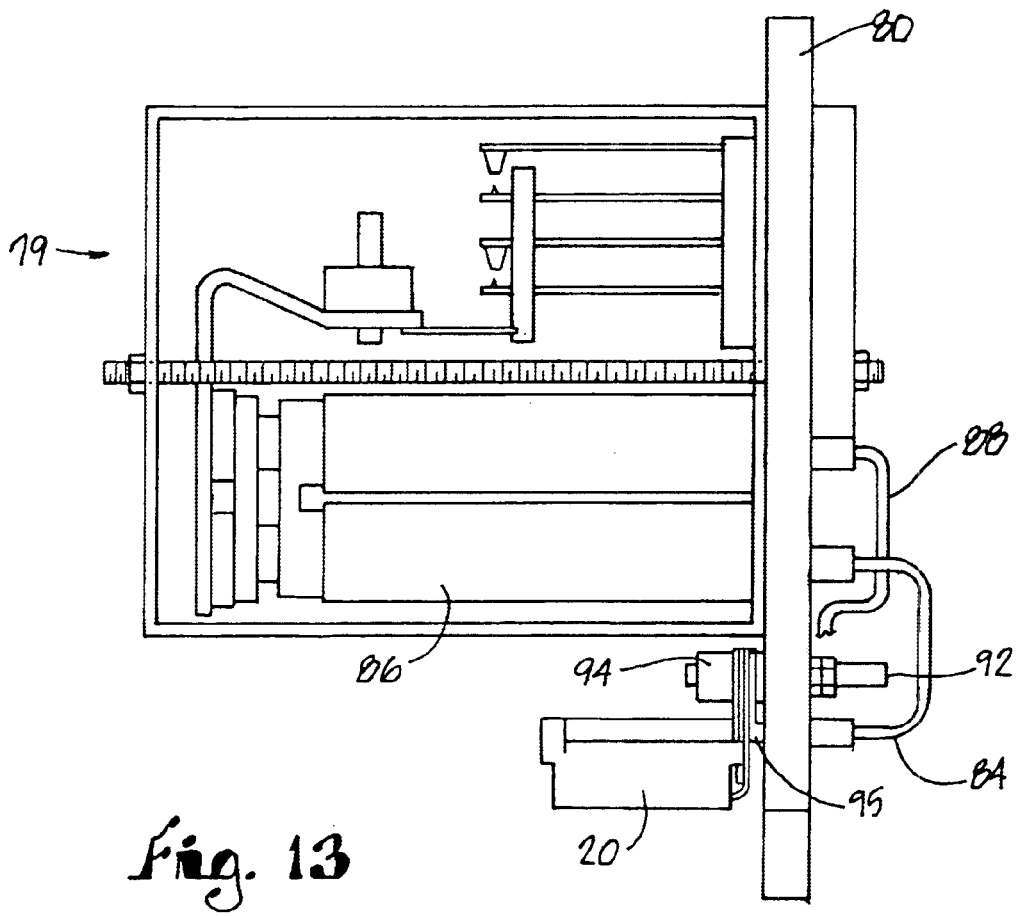
FIG. 13 is a side elevational view of a connectivity block installed on a relay block.

Once the connectivity blocks are installed, the relay may be connected to the test equipment for test by the simple insertion of the paddle 50 on the test cable. This operation may be accomplished in one or two seconds, isolating the relay under test from the circuit and connecting it to the test equipment. When inserted as shown in FIGS. 10–12, the paddle 50 opens the connection between the relay circuit (FIG. 15) and the high side of the relay coil 86 so that the relay is isolated from the circuit.

Connections to the high side 92 and low side 90 of the relay coil 86 allow full testing of the relay disconnected from the circuit but not removed from the rack. Since all three connections are wired back to the test equipment from the paddle 50, the connection from the relay circuit to the high side of the relay may be restored within the test equipment to allow train operation without requiring the removal of all the paddles. This feature is provided by the test equipment, however not without additional safety tests that are automatically run as the cables and paddles are first installed to ensure that all the cables have connectivity and that none of the wires are shorted to each other or to the ground.

Once this safety test has been satisfied, a multi-pin connector at the test equipment that supports up to eight paddles connected to different relays may be removed from the test connection and placed on a normal connection. Wires within the normal connector reconnect the high side of the relay coil to the relay circuit and allow safe operation of trains with the test equipment paddles installed. In this manner, testing personnel may stop testing and release track time to the dispatcher. This allows a train to pass through the side under test without requiring the removal of the test equipment. When the train is clear and track time has been returned to the maintenance personnel, the multi-pin connectors are returned to the TEST connection and the testing resumed.

When testing is finished, the paddles 50 are quickly removed and the relays are reconnected to the relay circuits by the contacts within the connectivity blocks 20. Since no wires within the signaling circuit have been disconnected or removed, none have to be reconnected. There is no possibility of disarrangement or mis-wiring. Railroad safety rules require a complete test of the signaling system if more than one wire is removed at a time, opening the possibility of disarrangement when the wires are reconnected. Thus, the connectivity blocks 20 allows the isolation of as many as 64 or 128 relays for example from their circuits for thorough automatic testing without violating the wire disarrangement rule and requiring a retest of the signaling system.

In addition to the test paddle 50 inserted in the connectivity block 20 to connect to the automatic test equipment, other paddles may be inserted into the block 20. A paddle with three wires provides temporary access to the relay coil isolated from its circuit and allows an immediate manual test of the relay or measurement of the circuit input voltage. Trouble shooting of the signaling system often requires maintenance personnel to drop a relay by opening the barrel nut 94 to disconnect the relay from the circuit. This is typically done to a track relay, since dropping the track relay 79 indicates the presence of a train in the block and will activate the appropriate signals and safety locks. With the connectivity block 20 installed, a blank paddle 50 may be inserted into the connectivity block 20. This paddle 50 separates the contacts of the sandwiched contacts 38 and 40 and isolates the relay from the circuit. Inserting and removing the paddle 50 is much simpler than loosening the barrel nut 94. The task is accomplished in much less time and precludes the potential problems that might result if the barrel nut 94 is not retightened properly or not at all.

It is to be understood that while certain forms of this invention have been illustrated and described, it is not limited thereto except insofar as such limitations are included in the following claims and allowable equivalents thereof.

Having thus described the invention, what is claimed as new and desired to be secured by Letters Patent is as follows:

1. A testing interface for a railroad signal relay that has a terminal provided with a pair of contact components which, when closed, establish a circuit to the relay coil and, when open, interrupt the circuit to the relay coil, said interface comprising:

a conductivity device for providing connections to test equipment, including a housing having a pair of spaced contact lugs insulated from each other and projecting therefrom for engagement with respective contact components when open, a pair of contact members in said housing electrically connected with respective lugs, and yieldable means in said housing normally maintaining said contact members in a closed condition, said housing having an access opening therein aligned with said contact members, and a connection paddle having a contact head presenting at least a pair of opposed contact surfaces insulated from one another, and leads extending from said surfaces for connecting the contact head to test equipment, said contact surfaces being configured to engage respective contact members and shift the members to an open condition against the bias of said yieldable means upon insertion of said contact head into said access opening in the housing, whereby to establish continuity from each of the contact components to a corresponding lead in the paddle to enable test equipment to be interposed in the relay circuit.

2. The testing interface as claimed in claim 1, wherein said housing further includes a third contact lug insulated from said pair of spaced contact lugs and projecting therefrom for engagement with a return side of the relay coil, a third contact member in said housing electrically connected with said third lug, said housing having a second access opening therein aligned with said third contact member.

3. The testing interface as claimed in claim 2, wherein said connection paddle includes a third contact surface insulated from said pair of opposed contact surfaces, and a third lead extending from said third contact surface for connection to test equipment.

4. The testing interface as claimed in claim 2 wherein said access openings in said housing are coplanar slots.

5. The testing interface as claimed in claim 1 wherein said contact members are spring terminals.

6. The testing interface as claimed in claim 1 wherein each of said contact members include a pair of spaced apart contacts.

7. The testing interface as claimed in claim 1, wherein said housing further includes a return connector insulated from said pair of spaced contact lugs and projecting therefrom for engagement with a return side of the relay coil, a third contact member in said housing electrically connected to said return connector, said access opening in said housing further aligned with said third contact member.

8. The testing interface as claimed in claim 7, wherein said connection paddle includes a third contact surface insulated from said pair of opposed contact surfaces, and a third lead extending from said third contact surface for connection to test equipment.

9. A testing interface for a railroad signal relay that has a terminal provided with a pair of contact components which, when closed, establish a circuit to the relay coil and, when open, interrupt the circuit to the relay coil and an associated return terminal, said interface comprising:

a conductivity block for providing connections to test equipment, including a housing having a first pair of spaced apart contact lugs insulated from each other and projecting therefrom for engagement with respective contact components when open, a first pair of opposed contact members in said housing electrically connected with said respective pair of contact lugs, yieldable means within said housing normally maintaining said pair of contact members in a closed position, a return contact means insulated from said pair of contact lugs projecting from said housing for engagement with a return terminal and a return contact member in said housing electrically connected to said return contact means, said housing having a first opening therein aligned with said pair of opposed contact members and a second opening therein aligned with said return contact member, and a connection probe having a contact head presenting a pair of opposed contact surfaces insulated from one another, a third contact surface insulated from said opposed contact surfaces, and leads extending from said surfaces for connecting the contact head to test equipment, said pair of opposed contact surfaces being configured to engage respective opposed contact members and shift the members to an open condition against the bias of said yieldable means and said third contact surface configured to engage said return contact member upon insertion of said contact head into said openings in the housing, whereby to establish continuity from each of the contact and return components to a corresponding lead in the probe to enable the test equipment to be interposed in the relay circuit.

10. The testing interface as claimed in claim 9 wherein said openings in said housing are coplanar slots.

11. The testing interface as claimed in claim 9 wherein said contact members are spring terminals.

12. The testing interface as claimed in claim 9 wherein each of said contact members includes a pair of spaced-apart contacts.

13. A testing interface for a railroad signal relay that has a terminal provided with a pair of contact components which, when closed, establish a circuit to the relay coil and, when open, interrupt the circuit to the relay coil, said interface comprising:

a conductivity block for providing connections to test equipment, including a housing having a pair of normally closed contacts and means for connecting said contacts with said respective contact components, a test probe having a contact head presenting at least a pair of contact surfaces insulated from one another and leads extending from said surface for connecting the test probe to test equipment, and means for engaging respective contact surfaces with respective contacts to shift said contacts from a closed position to an open position, whereby to establish continuity from each of the contacts to a corresponding lead in the probe to enable test equipment to be interposed in the relay circuit.

14. The testing interface as claimed in claim 13 wherein said housing further includes a return contact means insulated from said pair of contacts projecting from said housing for engagement with a return terminal connected to the return side of said relay coil circuit, a return contact in said housing electrically connected to said return contact means, and an access opening in said housing aligned with said return contact.

15. The testing interface as claimed access in claim 14 wherein said access opening includes two slots.

16. The testing interface as claimed in claim 13, wherein said contact head includes a third contact surface insulated from said pair of contact surfaces, and a third lead extending from said third contact surface for connection to test equipment.

17. The testing interface as claimed in claim 13 wherein said normally closed contacts each include a pair of opposed contact pads.

18. The testing interface as claimed in claim 13 wherein said means for connecting said contacts with said respective contact components include a pair of spaced apart contact lugs insulated from each other.

* * * * *